United States Patent [19]

Maas

[11] Patent Number: 4,937,202

[45] Date of Patent: Jun. 26, 1990

[54] METHOD OF MANUFACTURING FIELD EFFECT TRANSISTORS HAVING SELF-REGISTERING SOURCE AND DRAIN REGIONS TO MINIMIZE CAPACITANCES

[75] Inventor: Henricus G. R. Maas, Eindhoven, Netherlands

[73] Assignee: U.S. Philips Corporation, New York, N.Y.

[21] Appl. No.: 272,660

[22] Filed: Nov. 17, 1988

Related U.S. Application Data

[60] Division of Ser. No. 721,123, Apr. 8, 1985, Pat. No. 4,825,267, which is a continuation of Ser. No. 306,121, Sep. 28, 1981, abandoned.

[30] Foreign Application Priority Data

Oct. 15, 1980 [NL] Netherlands ............... 8005673

[51] Int. Cl.⁵ ............... H01L 21/203; H01L 21/265; H01L 21/336
[52] U.S. Cl. ............... 437/40; 437/38; 437/41; 437/46; 437/89; 437/203; 437/228
[58] Field of Search ............... 437/29, 38, 40, 41, 437/46, 56, 57, 228, 203, 89; 357/23.4, 55

[56] References Cited

U.S. PATENT DOCUMENTS

| | | | |
|---|---|---|---|
| 4,003,126 | 1/1977 | Holmes et al. | 437/89 |
| 4,041,518 | 8/1977 | Shimizu | 437/89 |
| 4,065,783 | 12/1977 | Ouyang | 148/DIG. 168 |
| 4,084,175 | 4/1978 | Ouyang | 437/38 |
| 4,116,720 | 9/1978 | Vinson | 148/DIG. 168 |
| 4,272,302 | 6/1981 | Jhabvala | 437/38 |
| 4,609,407 | 9/1986 | Masao et al. | 437/89 |

FOREIGN PATENT DOCUMENTS

| | | | |
|---|---|---|---|
| 2035687 | 6/1980 | European Pat. Off. | 437/233 |
| 0030640 | 6/1981 | European Pat. Off. | 437/38 |

*Primary Examiner*—Brian E. Hearn
*Assistant Examiner*—T. Thomas
*Attorney, Agent, or Firm*—Paul R. Miller

[57] ABSTRACT

A field effect transistor is made with a source and drain which are utilized partly as a semiconductor region in a semiconductor body, and partly as a portion of a deposited epitaxial layer. A recess is formed into a substrate of the semiconductor body between the source and drain, and a channel region underlies the recess in the substrate. As a result of this construction, the channel length is independent of variations in the thickness of the epitaxial layer, and the stray capacitances from source and drain to the substrate are small. Moreover, a conductor pattern, separated from the epitaxial layer by an insulating layer, may extend to be on the connection zones of the source and drain, which involves a high packing density. The epitaxial layer, moreover, comprises extra wiring tracks. This gives a greater freedom in design.

11 Claims, 6 Drawing Sheets

METHOD OF MANUFACTURING FIELD EFFECT TRANSISTORS HAVING SELF-REGISTERING SOURCE AND DRAIN REGIONS TO MINIMIZE CAPACITANCES

This application is a divisional of application Ser. No. 721,123, filed Apr. 8, 1985, now U.S. Pat. No. 4,825,267, which is a continuation of previous Ser. No. 306,121, filed Sept. 28, 1981 (now abandoned), and all benefits of such earlier applications are hereby claimed for this new divisional application.

The invention relates to a semiconductor device having at least a field effect transistor The semiconductor device is one comprising a semiconductor body having a substrate of a first conductivity type and having a surface region of a second conductivity type at a surface at least at the area of a source region and a drain region of the field effect transistor. Between the source region and the drain region at least a recess is present which extends into the substrate and which defines a channel region of the transistor. The recess includes at least one gate electrode separated from the channel region by an insulating layer.

The invention relates moreover to a method of manufacturing such a semiconductor device.

Field effect transistors are used in integrated circuits, both in digital circuits (logic circuits, memories) and in analog circuits (for example, operational amplifiers). In these uses it is endeavoured to obtain a highest possible packing density of the various elements such as transistors, diodes, resistors, etc. on one semiconductor substrate. In order to achieve this it is endeavoured to give the transistors smaller and smaller dimensions.

A field effect transistor of the above-mentioned type is disclosed in U.S. Pat. No. 4,003,126. The field effect transistor shown in this patent comprises two parts of a surface region which are separated from each other by a V-groove and which form a source zone and a drain zone, respectively, of the field effect transistor. Between the parts of the surface region and the surrounding substrate in which the surface region is realized, pn-junctions are present. As a result of the capacitance associated with such p-n junctions, the field effect transistor shown, depending on the area of the source region and the drain region, has high capacitances between the source region and the substrate and between the drain region and the substrate, respectively. These capacitances have a detrimental influence on the speed of such a transistor and circuit arrangements manufactured therewith. The effective surfaces of the p-n junctions are restricted to minimum dimensions determined by the minimum dimensions of the contact holes of the source and drain regions and by the tolerances between the mask which defines the contact holes and the mask which defines the groove.

Moreover, in the device shown in the U.S. Pat. No. 4,003,126 the contact metallizations (electrodes) of the source region, drain region and gate electrode, are formed from the same metal layer. In order to obtain a good spatial separation of the connection electrodes, a large tolerance must be observed, which is at the cost of the packing density.

It is the object of the invention to provide a field effect transistor in which the switching speed is not influenced or is influenced only to a small extent, by the capacitances between the source region and the drain region, respectively, and the substrate.

Another object of the invention is to provide a field effect transistor in which the source region and the drain region can be provided in a self-registering manner.

Still another object of the invention is to provide a field effect transistor which permits a large packing density in that the alignment tolerances between the source region and gate electrode and between the drain region and gate electrode, respectively, are not critical.

The invention is based on recognition of the fact that the above can be achieved by giving the source and drain regions a particular construction. In addition, it is based on the recognition of the fact that such a construction permits a high packing density in that the connection zones of source and drain regions are manufactured in a process step other than that in which the gate electrode is manufactured.

A semiconductor device according to the invention is characterized in that the surface region of the second conductivity type is separated from the substrate at least over a part of its surface by an insulating layer and comprises a polycrystalline semiconductor material.

As a result of this measure, the substrate and the surface region which comprise the source and drain region of the field effect transistor are separated from each other partly by an insulating layer. This has for a result that the surfaces of the p-n junctions between the surface region, and the substrate, and hence, the associated capacitances, may be considerably smaller than in the case in which the surface region from a p-n junction with the substrate over its entire surface.

A preferred embodiment of a semiconductor device in accordance with the invention is characterized in that the part of the surface region of the second conductivity type separated from the substrate by an insulating layer forms a connection zone for a source region or a drain region of a field effect transistor.

As a result of this, source and drain regions are manufactured in an entirely self-registering manner. Since in addition the gate electrode is manufactured in a step other than that of the connection zones, the minimum distance between the edge of the connection zones and the edge of the gate electrode may be chosen to be much larger than in known transistors. Even a partial overlap is permitted so that very high packing densities can be achieved with such a transistor.

Such a connection zone preferably forms part of a wiring layer which is separated from the substrate by an insulating layer, and comprises polycrystalline semiconductor material. The wiring layer may form part of a multi-layer wiring system in which a second layer consists of a conductor pattern provided on a layer of insulating material covering the polycrystalline silicon, and further, parts of the device. Such a multi-layer wiring system provides a large freedom in design.

A method of manufacturing a semiconductor device in accordance with the invention is characterized in that it is started from a semiconductor body having a monocrystalline semiconductor substrate of a first conductivity type which is covered at a surface with a masking layer of insulating material comprising at least one aperture, and in which the semiconductor body with the side of the surface is then subjected to an epitaxy treatment from the gaseous phase, in which an epitaxial layer is deposited, of which a part in the apertures on the semiconductor surface grows monocrystalline and a part on the masking layer grows polycrystalline, such epitaxial layer is doped with impurities causing a second conductivity type opposite to the first, after which at the area of the apertures in the masking layer at least a recess is provided down into the semiconductor substrate, and the walls of the recess are then provided with a layer of insulating material, on which layer at least one gate electrode is provided, while the masking layer remains as a separating layer between the substrate and at least parts of the epitaxial layer which comprise connection zones for the source and drain regions.

In this method, preferably prior to the epitaxial treatment, at a temperature lower than that at which the epitaxial layer is deposited, an amorphous or polycrystalline layer is deposited both on the masking layer, and on the uncovered semiconductor surface in the apertures in the masking layer, of which the layer portion in the apertures on the uncovered semiconductor body changes into the monocrystalline state by a thermal treatment preceding the deposition of the epitaxial layer.

In this manner, it is achieved that the monocrystalline and polycrystalline parts of the epitaxial layer readily adjoin each other as described in Netherlands Patent Application no. 7810549 of Applicants.

A preferred embodiment of a method of manufacturing a field effect transistor in accordance with the invention is characterized in that at least at the area of the apertures in the masking layer, the impurities causing the second conductivity type are provided by means of doping down to a depth which is larger than the maximum thickness of the epitaxial layer.

This has for its advantage that, since the depth of such a doping can very readily be adjusted, the doping takes place throughout the surface of the device down to substantially the same depth. Variations in the thickness of the epitaxial layer which can be provided with a much smaller accuracy therefore have no influence on the depth of the p-n junction between the surface region and the substrate. As a result of this such variations do not influence or hardly influence the channel length so that the field effect transistors have a substantially constant channel length throughout the surface area.

A second advantage consists in that the doped surface region oxidizes more rapidly than the undoped substrate. This has for its result that the gate oxide which is grown in a subsequent step is a few times thicker at the area where it covers the source and drain region than it is in the channel region. The stray capacitances between the gate electrode and the source and drain regions are considerably reduced hereby.

The invention will now be described in greater detail with reference to a few embodiments and the drawings, in which FIG. 10 shows an electric equivalent circuit diagram of a part of a memory circuit in which a field effect transistor according to the invention is used, while

The Figures are diagrammatic and not drawn to scale in which, for clarity, especially, the dimensions in the direction of thickness are strongly exaggerated in the cross-sectional views. Semiconductor zones of the same conductivity type are generally shaded in the same direction; in the various embodiments, corresponding parts are generally referred to by the same reference numerals.

Figure 1:
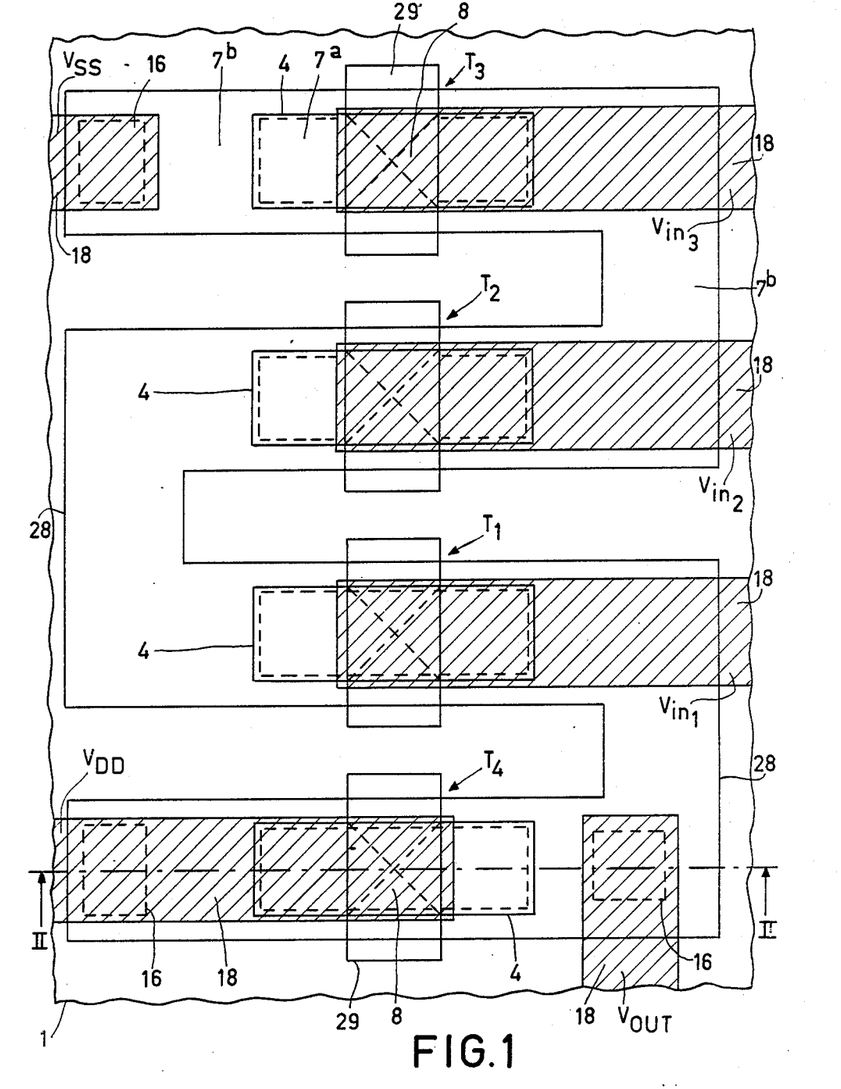
FIG. 1 is a plan view of a semiconductor device according to the invention.
Figure 2:
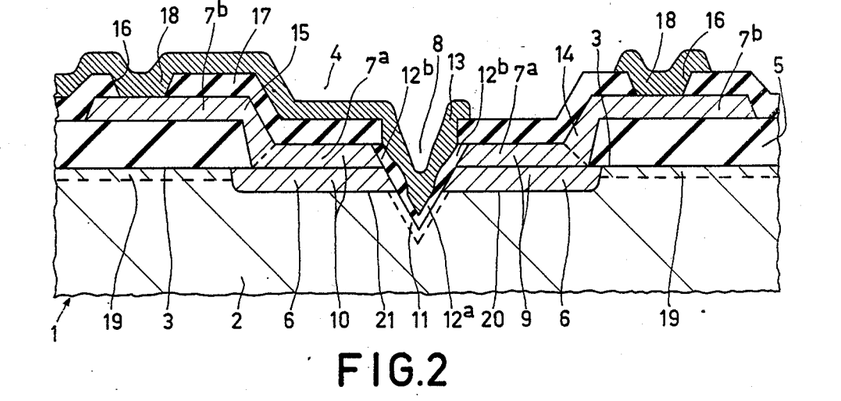
FIG. 2 is a cross-sectional view taken on the line II—II of FIG. 1.
Figure 3:
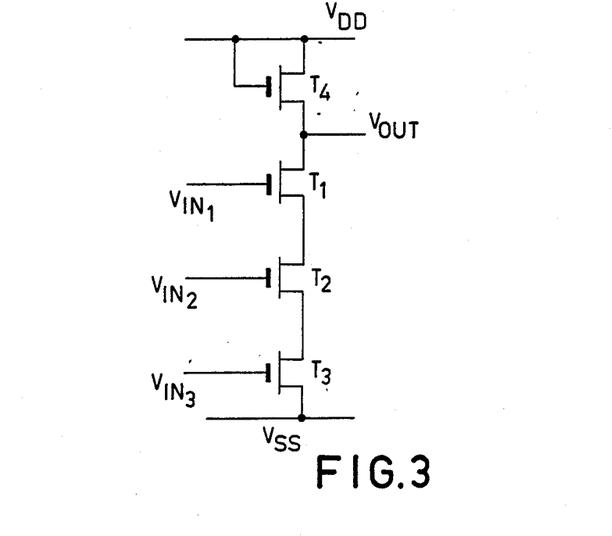
FIG. 3 shows an electric equivalent circuit diagram of the device shown in FIGS. 1 and 2.

FIG. 1 is a plan view of a logic gate of the NAND-type of which the electric equivalent circuit diagram is shown in FIG. 3, while FIG. 2 is a cross-sectional view taken on the line II—II of FIG. 1. The semiconductor device of FIGS. 1 and 2 comprises in this example a semiconductor body 1 of silicon having a substrate 2 of the p-type, <100> oriented and with a resistivity of 8 to 12 ohm. cm.

A number of field effect transistors T1, T2, T3, T4 is realized at the surface 3 of the substrate 2. These are present at the area of apertures 4 in a layer 5 of insulating material, in this example silicon oxide. A surface region of the n-type is present on the insulating layer 5 and at the area of the aperture 4. At the area of the aperture 4 the surface region consists of a diffused zone 6 and a monocrystalline epitaxial layer 7a deposited on the surface 3. Beyond the apertures 4 the surface region consists of a polycrystalline epitaxial layer 7b deposited on the oxide.

V-shaped recesses 8 are furthermore present in the apertures 4. Such a recess 8 separates within an aperture 4 the surface region 6, 7a in a source region 9 and a drain region 10. The recess 8 extends into the substrate 2 and defines therein a channel region 11. The channel region 11 is separated from a gate electrode 13 by a thin layer of gate oxide 12. The layer 12 also separates the gate electrode 13 over a part of the walls of the groove 8 from the source region 9 and the drain region 10, respectively.

The polycrystalline layers 7b-comprise connection zones 14 and 15 for the source and drain regions. These connection zones 14, 15 are connected, by contact holes 16 in an electrically insulating layer of silicon oxide 17, to a conductor pattern 18 which comprises, for example, doped polycrystalline silicon. This pattern of conductors 18 contacts in various places by contact holes 16 a wiring pattern which is formed from the polycrystalline epitaxial layer 7b separated from the substrate 2 by the oxide layer 5.

In order to prevent the mutual influencing of various field effect transistors, the device furthermore comprises channel stopping regions 19.

In such a transistor the source region 9, the drain region 10 and the associated connection zones 7b form part of the same surface region 6, 7. By the measure according to the invention this surface region is separated from the substrate 2 over a large part by the oxide layer 5. The stray capacitance between the substrate 2 and the source and drain regions 9 and 10, respectively, is therefore determined substantially exclusively by the surfaces of the p-n junctions 20, 21. These surfaces are determined exclusively by the mutual tolerances of the masks which determine the aperture 4 and the recess 8, respectively, and may hence be many times smaller than in known field effect transistors.

Moreover, since the source and drain regions are defined by the monocrystalline parts 7a of the epitaxial layer, they can be provided in a self-registering manner within the aperture 4. The polycrystalline parts 7b adjoining the monocrystalline parts 7a form part of a wiring system comprising the connection zones 14 and 15 of source and drain regions 9 and 10. The gate electrode 13 is manufactured in a separate metallization step; this means that no tolerances need be observed between gate electrode and connection zones, which enables a further reduction of the dimensions of the field effect transistor. As a result of this and due to the fact that the polycrystalline silicon layer 7b also serves as an interconnection layer, a very high packing density can be achieved in an integrated circuit manufactured with field effect transistors in accordance with the invention.

Figure 4:
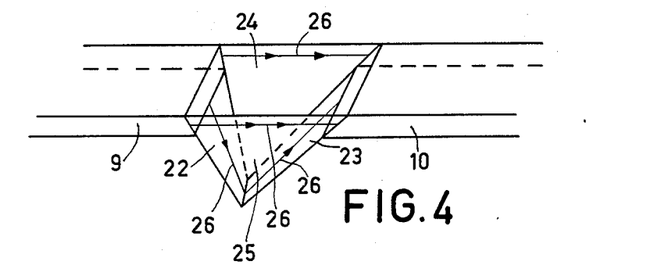
FIG. 4 shows diagrammatically the current path in a field effect transistor according to the invention.
Figure 5:
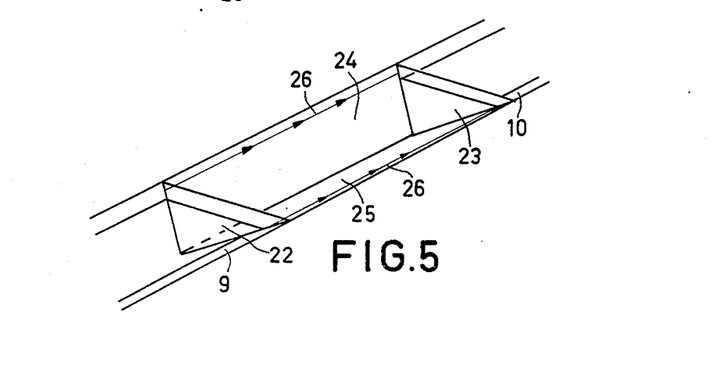
FIG. 5 shows diagrammatically similar current paths in another construction of a field effect transistor according to the invention.

For the current through a field effect transistor it holds that:

$$I = I_{DSS}\left(1 - \frac{V_{GS}}{V_P}\right)^n, \text{ with } V_{DS} = \text{constant}$$

wherein:
- $V_{GS}$: voltage between gate and source region
- $V_{DS}$: voltage between source and drain region
- $V_P$: pinch off voltage
- $n \sim 2$:, while $I_{DSS} \sim W/L \mu$,
- $\mu$: mobility of the charge carriers
- W: channel width
- L: channel length In the above example the groove has a V-shaped cross-section and the shape of an upside down pyramid, see also FIG. 4. In this case the constant $I_{DSS}$ is consequently no longer determined as such by width and length of the groove since conduction of charge carriers can take place along all four side faces 22, 23, 24, 25, as indicated by arrows 26 in FIG. 4. In another shape of the groove, as shown in FIG. 5, which, viewed in the direction of current, also has a V-shaped cross-section, the current along the side faces 22, 23 is substantially negligible and $I_{DSS}$ is substantially entirely determined by the two side faces 24, 25 along which the charge carriers move (arrows 26).

Figure 6:
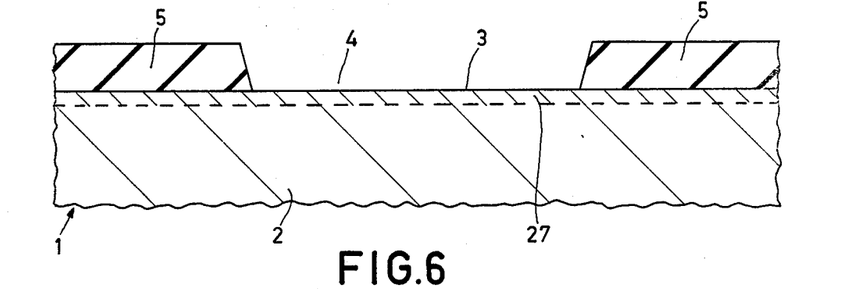
FIGS. 6 and 7 show the semiconductor device of FIG. 2 during steps in its manufacture.
Figure 7:
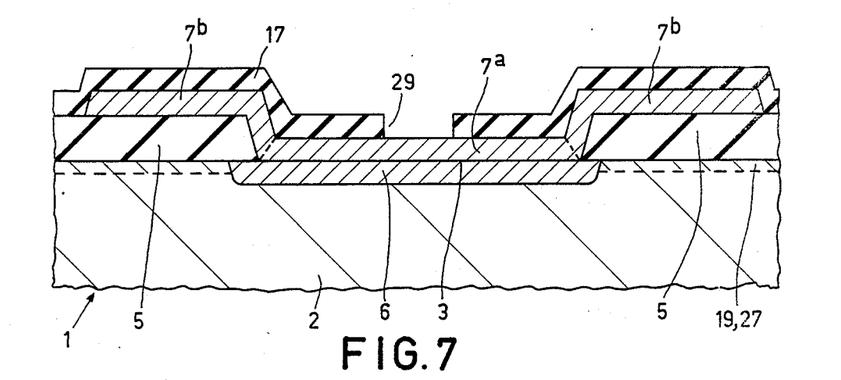

The semiconductor device shown in FIGS. 1, 2 can be manufactured as follows (see FIGS. 6 and 7).

Starting material is a <100> oriented p-type silicon substrate having a resistivity of 8 to 12 ohm.cm. On a surface 3 of the substrate 2 an insulating layer 5 is then provided, for example, by oxidation until a layer of silicon dioxide of approximately 0.45 micrometer has grown.

In order to form channel stopping regions between the field effect transistors to be formed, an implantation with boron ions is then carried out all over the surface. The implantation dose is $1.5 \times 10^{13}$ ions/cm$^2$ with an energy of 150 keV. This results in an increased acceptor concentration in a circuit region 27 immediately below the oxide 5. At the area of the field effect transistors to be provided, an aperture 4 is then provided photolithographically in the oxide 5. Herewith the device shown in FIG. 6 is obtained.

An approximately 20 nanometers thick layer of polycrystalline silicon is then deposited at a subatmospheric pressure of 0.5 Torr and at temperature of 625° C. both in the aperture 4 on the silicon surface and on the oxide layer 5. In a subsequent thermal treatment the layer of polycrystalline silicon in the aperture 4 changes into monocrystalline silicon as a result of recrystallization, while the layer in other places remains polycrystalline. All this has been described in detail in Netherlands Patent Application no. 7810549 in the name of Applicants the contents of which are deemed to be incorporated in this Application by reference.

The epitaxial layer 7 which is then deposited at a temperature of approximately 1050° C. forms a monocrystalline part 7a within the aperture 4 and a polycrystalline part 7b beyond the aperture. The thickness of the layer which on an average is 0.5 micrometer may vary, for example, between 0.4 micrometer and 0.6 micrometer. In order to form source and drain regions, the layer 7 is then doped, for example, with phosphorus which is provided by means of diffusion. This diffusion, notably within the aperture 4, is continued down to a depth of 0.7 micrometer so that even at a maximum thickness of the epitaxial layer of 0.6 micrometer the depth of the p-n junction 20, 21 between substrate 2 and source region 9 and drain region 10, respectively, is determined entirely by the diffusion step which may be done very accurately. Herewith the depth and hence the channel length of the field effect transistor to be formed has become independent of the thickness of the epitaxial layer 7.

After patterning the polycrystalline silicon 7b in behalf of a first wiring layer (the wiring tracks 28 in FIG. 1) the whole device is covered with a layer 17 of silicon oxide (0.4 micrometer thick). A window 29 (see FIG. 1) is provided photolithographically in the layer 17 for providing the recess 8. Herewith the device shown in FIG. 7 is obtained.

The recess 8 is then provided within the window 29 by means of anisotropic etching down to a depth of approximately 0.8 micrometer. For this purpose a potassium hydroxide/isopropanol solution is used at a temperature of approximately 60° C. The etching treatment takes place down into the substrate 2 to an accurately determined depth from the surface 3. Since the diffusion with which source and drain regions 9, 10 have been formed have also been carried out down to a substantially uniform depth throughout the semiconductor device, the channel length is constant over the whole device so that very readily reproducible transistors can be manufactured. The polycrystalline silicon exposed in the window is also etched away by means of this etching step so that short-circuits, if any, between source and drain region are avoided.

In a subsequent step, the gate oxide 12 is grown within the aperture 29 by means of thermal oxidation. At the area of the substrate 2 where the actual channel 11 is present, the oxidation is continued until a thickness of approximately 50 nanometers has been reached. This oxide 12 grows simultaneously on parts 7a of the monocrystalline silicon exposed within the aperture 29 in which source and drain region 9 and 10, respectively, have been formed. This growth which takes place in a wet nitrogen atmosphere at a temperature of approximately 850° C. proceeds much more rapidly (4 to 5 times) on the doped silicon 6, 7a than on the undoped substrate 2. As a result of this, the oxide at the location where it serves as an insulation between the gate electrodes 13 and the source and drain regions 9, 10 is considerably thicker than the actual gate oxide 12a at the area of the channel region 11. This results in a decrease of the stray capacitance between source/drain regions 9, 10 and the gate electrode 13.

In order to obtain an accurate adjustment of the threshold value, the acceptor concentration in the channel region 11 can be increased, if desired, by means of an ion implantation with, for example, boron ions.

After providing contact holes 16 in the oxide 17 so as to connect the connect zones 14, 15 and possibly other places of the first wiring pattern 28, a layer of conductive material is provided over the assembly. In order to obtain notably in the recesses 8 a good step coating, polycrystalline silicon is chosen for this purpose which is deposited at low pressure and is then doped. After the conductor pattern 18 has been formed herefrom in a generally known manner, the device shown in FIG. 2 is completed.

Figure 8:
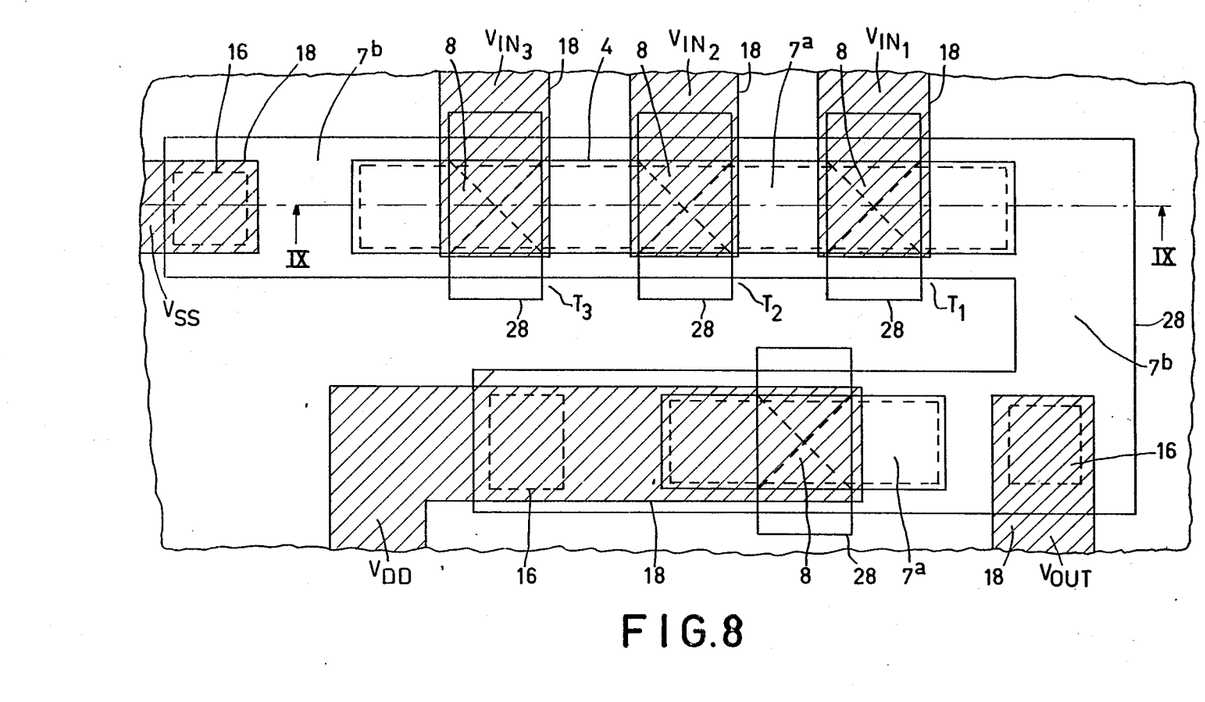
FIG. 8 is a plan view of another embodiment of the circuit shown in FIG. 3.
Figure 9:
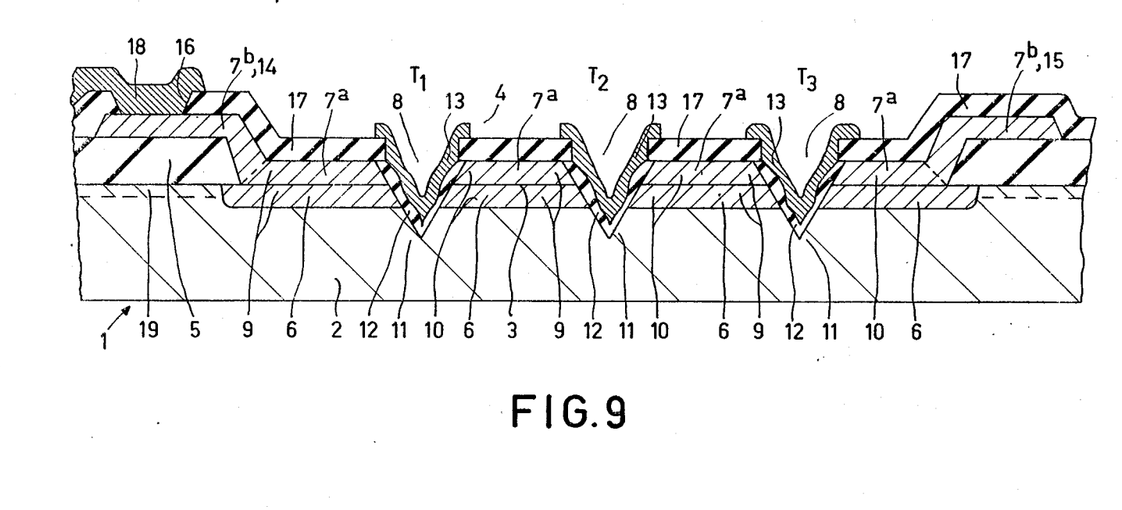
FIG. 9 is a cross-sectional view of this device taken on the line IX—IX of FIG. 8.

FIGS. 8 and 9 are a plan view and a cross-sectional view, respectively, of another embodiment of the circuit arrangement shown in FIG. 3. In this embodiment the transistors $T_1$, $T_2$, $T_3$ are defined in one aperture 4 by providing three recesses 8. The source region 9 of the transistor $T_1$ and the drain region 10 of transistor $T_3$ form part of the same surface region 6, 7 with the associated advantages of a low stray capacitance between the source and drain region, respectively, and the substrate.

Since the drain regions of transistors $T_1$ and $T_2$, respectively, coincide with the source regions of transistors $T_2$ and $T_3$, respectively, these common regions may be chosen to be very small. As a result of this a very high density is obtained. The reference numerals in FIGS. 8 and 9 have the same meanings as in FIGS. 1 and 2.

Figure 10:
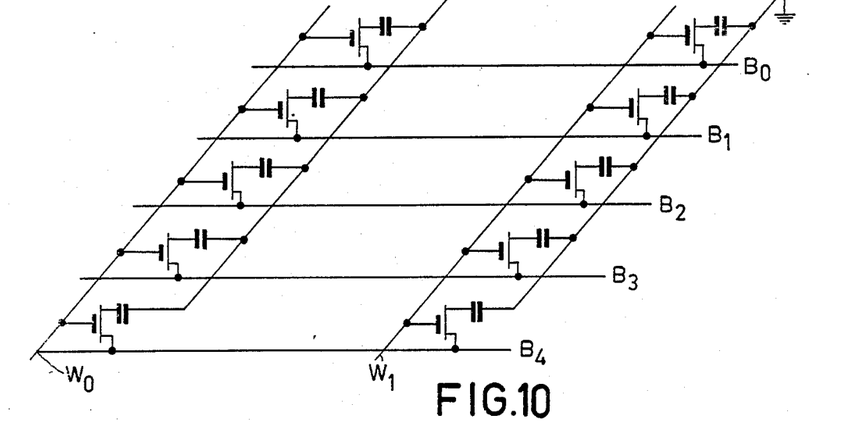

FIG. 10 shows diagrammatically a part of a dynamic memory in which a field effect transistor according to the invention is used, with word lines $W_0$, $W_1$ and bit lines $B_0$, $B_1$ ... $B_4$. At the crossings of word and bit lines memory cells having one transistor per cell are present. The memory information is stored in storage capacitances formed by the capacitance between the connection zone of the drain region of the transistor and an overlying reference surface of conductive material which are separated from each other by a dielectric.

Figure 11:
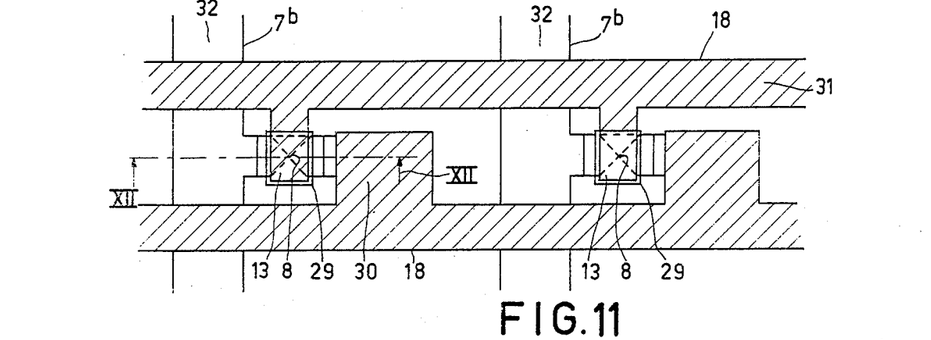
FIG. 11 is a plan view of a part of such a memory circuit.
Figure 12:
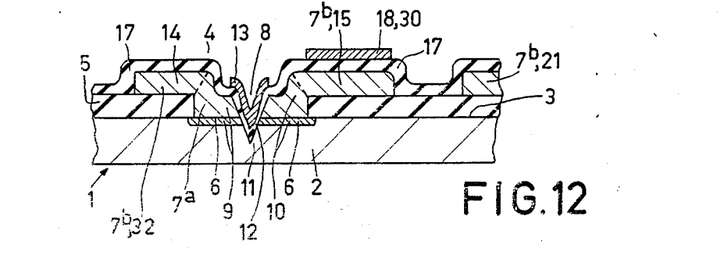
FIG. 12 is a cross-sectional view taken on the line XII—XII of FIG. 11.

FIG. 11 is a diagrammatic plan view of such a cell and FIG. 12 is a cross-sectional view taken on the line XII—XII of FIG. 11. The reference surface 30 which in this example is connected to ground forms part of the conductor pattern 18, while the dielectric of the capacitor is formed by the oxide layer 17. The word lines $W_0$, $W_1$ also form part of the conductor pattern 18. Each word line connects a number of gate electrodes 13 of transistors which form part of a cell. The number of cells which is driven by a word line determines the number of bits per word. The word line 31 in FIG. 11 also forms part of the conductor pattern 18, while the bit lines 32 are formed by wiring tracks of polycrystalline silicon 7b which are connected to source regions 9 of the transistors. Otherwise, the reference numerals in FIGS. 11 and 12 have the same meanings as in the preceding Figures.

When writing, by applying a voltage at the word line, the transistors connected thereto become conductive. Dependent on the voltage at the bit lines, which corresponds to a given information pattern, the capacitors are charged or are not charged. During reading information, the transistors are also made conductive so that by the bit lines, or if desired by output amplifiers, the information can be scanned.

Of course the invention is not restricted to the above embodiments. It will be obvious that numerous variations are possible to those skilled in the art without departing from the scope of this invention. For example, recesses other than V-shaped recesses are possible. They may be, for example, U-shaped. The gate electrode 13, instead of doped polycrystalline silicon, may be manufactured from aluminium. In addition, several gate electrodes may be provided in the groove shown in FIG. 5; in this manner, for example, a tetrode-MOST can be realized. Numerous variations are also possible in the method; for example, the source and drain regions may be provided by means of a suitable ion implantation instead of by diffusion.

After the gate electrode 13 has been manufactured from polycrystalline silicon in behalf of a good step coating, the remaining part of the conductor pattern 18 may also be manufactured from a different material, for example, aluminium.

What is claimed is:
1. A method of manufacturing a semiconductor device comprising the steps of
   (a) forming an insulating layer on a surface of a semiconductor substrate of silicon by oxidizing said substrate to form a layer of silicon dioxide, said insulating layer having a thickness of approximately 0.45 $\mu$m,
   (b) implanting ions through said insulating layer over said surface with an ion implantation dose of $1.5 \times 10^{13}$ ions/cm$^2$ at 150 keV, said ion implantation forming an increased acceptor level at said surface,
   (c) forming at least one aperture through said insulating layer to said surface,
   (d) depositing a layer of polycrystalline silicon of a thickness ranging from 2 nm to at most 100 nm both on said surface in said aperture and on said insulating layer, said layer of polycrystalline silicon being deposited at a pressure rangiing from 0.01 to 10 Torr and at a temperature below 800° C.,
   (e) thermally heating said layer of polycrystalline silicon to change said layer in said aperture to monocrystalline silicon by recrystallization,
   (f) depositing an epitaxial layer of silicon over said monocrystalline silicon and remaining portions of said polycrystalline silicon at a temperature of approximately 1050° C., said epitaxial layer forming a monocrystalline portion in said aperture and a polycrystalline portion outside said aperture, said epitaxial layer having a thickness ranging from 0.4 $\mu$m to 0.6 $\mu$m,
   (g) doping said epitaxial layer in said aperture with phosphorous by diffusion,
   (h) continuing said diffusion below said epitaxial layer into said substrate to a depth of 0.7 $\mu$m,
   (i) patterning said polycrystalline portion of said epitaxial layer into a first wiring layer,
   (j) covering the entire structure with a layer of silicon oxide,
   (k) photolithographically forming a window through said layer of silicon oxide at said at least one aperture,
   (l) anisotropically etching a recess into said substrate to a depth of 0.8 $\mu$m through said window at said at least one aperture, said recess forming source and drain regions in said substrate at said surface at opposite sides of said recess, (m) providing a channel between said source and drain regions, said channel extending below said recess, and (n) growing gate oxide in said recess by thermal oxidation, said oxidation continuing in said recess adjacent said channel region until an oxide thickness of approximately 50 nm is achieved, said oxidation proceeding faster adjacent doped regions of said substrate than adjacent undoped regions of said substrate, such that said gate oxide is considerably more thickener between a gate electrode and said source and drain regions than adjacent said channel region, wherein stray capacitances between said source and drain regions and said gate electrode are decreased.

2. A method according to claim 1, wherein said step (b) is carried out by increasing acceptor concentration in said channel by ion implantation of boron ions.

3. A method according to claim 1, wherein said step (b) of implanting ions is carried out by implanting boron ions.

4. A method according to claim 1, wherein said step (c) is carried out to form a plurality of apertures, and wherein said remaining steps (d)–(n) are carried out in relation to said plurality of apertures.

5. A method according to claim 1, wherein said step (d) is carried out at a pressure of approximately 0.5 Torr.

6. A method according to claim 1, wherein said step (d) is carried out to deposit a thickness of approximately 20 nm of said polycrystalline silicon.

7. A method according to claim 1, wherein said step (d) is carried out at a temperature of approximately 625° C.

8. A method according to claim 1, wherein said step (f) of depositing an epitaxial layer is carried out to a thickness of approximately 0.5 $\mu$m.

9. A method according to claim 1, wherein said step (j) of covering with a layer of silicon oxide is carried out to a thickness of 0.4 $\mu$m.

10. A method according to claim 1, wherein said step (l) is carried out to form said recess as one of V-shaped or U-shaped.

11. A method according to claim 1, wherein said step (n) of growing gate oxide is carried out in a wet nitrogen atmosphere at a temperature of approximately 850° C.

* * * * *